(12) United States Patent
Lewis

(10) Patent No.: US 10,657,935 B2
(45) Date of Patent: May 19, 2020

(54) MAGNUM OPUS METHOD, PROGRAM, AND APP

(71) Applicant: Debra Diane Lewis, Chicago, IL (US)

(72) Inventor: Debra Diane Lewis, Chicago, IL (US)

(73) Assignee: Debra Diane Lewis, Chicago, IL (US)

( * ) Notice: Subject to any disclaimer, the term of this patent is extended or adjusted under 35 U.S.C. 154(b) by 0 days.

(21) Appl. No.: 16/137,281

(22) Filed: Sep. 20, 2018

(65) Prior Publication Data

US 2019/0189101 A1 Jun. 20, 2019

Related U.S. Application Data

(60) Provisional application No. 62/607,300, filed on Dec. 18, 2017.

(51) Int. Cl.
| | |
|---|---|
| *G10H 1/00* | (2006.01) |
| *G10G 3/04* | (2006.01) |
| *H03M 7/40* | (2006.01) |
| *G10G 1/00* | (2006.01) |
| *H03M 7/14* | (2006.01) |

(52) U.S. Cl.
CPC ............. *G10H 1/0041* (2013.01); *G10G 1/00* (2013.01); *G10G 3/04* (2013.01); *G10H 1/0008* (2013.01); *H03M 7/14* (2013.01); *H03M 7/40* (2013.01)

(58) Field of Classification Search
CPC ....... G10H 2210/066; G10H 2220/106; G10H 2220/101; G10H 2210/145; G10H 2210/091; G10H 2210/031; G09B 15/00; G09B 15/003; G09B 15/02; G09B 15/009; A63F 2300/8047; G10G 1/00; G10G 1/02; G10G 1/04
See application file for complete search history.

(56) References Cited

U.S. PATENT DOCUMENTS

| | | | | |
|---|---|---|---|---|
| 4,603,386 A * | 7/1986 | Kjaer | ....................... | B41M 3/04 400/116 |
| 4,750,399 A * | 6/1988 | Coles | .................... | G10H 1/0008 84/478 |
| 4,903,572 A * | 2/1990 | Coles | ....................... | G10G 1/02 84/442 |
| 5,129,303 A * | 7/1992 | Coles | ................... | G10H 1/0008 84/442 |
| 5,496,179 A * | 3/1996 | Hoffman | ............... | G09B 15/003 434/433 |
| 5,841,053 A * | 11/1998 | Johnson | .................... | G10C 3/12 84/615 |
| 6,057,503 A * | 5/2000 | Shinsky | ................ | G10H 1/0025 84/613 |
| 2002/0029685 A1 * | 3/2002 | Aoki | ......................... | G10H 1/38 84/613 |

(Continued)

*Primary Examiner* — Marlon T Fletcher

(57) ABSTRACT

A method and system for rendering coded messages of any length is disclosed. The present invention includes writing a message, assigning alphanumeric characters and symbols to unique positions on piano keys aligned with Standard Music Notation (SMN) in accordance with a music scale or music mode. The aforementioned elements may be utilized with any or no time signature, and/or Morse code rhythms. The present invention may be applied to, combined, integrated, included with or within but not limited to: music, musical compositions, music performance, recordings, computer applications, film, virtual reality, and video games.

1 Claim, 4 Drawing Sheets

100 - an example of alphanumeric characters and symbols aligned with piano keys that correspond to the key of C major 102 - the dots and dashes shown above equate to Morse code rhythms 101 - Standard Music Notation (SMN) in the key of C major is shown above

(56) References Cited

U.S. PATENT DOCUMENTS

| | | | | |
|---|---|---|---|---|
| 2002/0050206 A1* | 5/2002 | MacCutcheon | ...... | G09B 15/023 |
| | | | | 84/477 R |
| 2007/0044638 A1* | 3/2007 | Egan | ...... | G09B 15/00 |
| | | | | 84/483.2 |
| 2008/0127810 A1* | 6/2008 | Egan | ...... | G09B 15/00 |
| | | | | 84/483.2 |
| 2008/0202318 A1* | 8/2008 | Mataele | ...... | G09B 15/023 |
| | | | | 84/483.2 |
| 2019/0189101 A1* | 6/2019 | Lewis | ...... | G10H 1/0041 |

* cited by examiner

MAGNUM OPUS METHOD, PROGRAM, AND APP

CROSS-REFERENCE TO RELATED APPLICATIONS

This patent application claims the benefit of provisional patent application Ser. No. 62/607,300 filed Dec. 18, 2017.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC

Not Applicable.

FIELD OF INVENTION

The present invention relates to a method of coding messages with music notation. In particular, an embodiment of the present invention relates to a method and system of assigning alphanumeric characters and symbols to a music scale or music mode and translating said elements into Standard Music Notation (SMN).

BACKGROUND OF THE INVENTION

Standard Music Notation (SMN) is a universally accepted method of writing music that has evolved into what is commonly known as "sheet music" or "musical scores" to represent a musical composition in a graphic form and is readily understood by most musicians around the world.

An alphanumeric character set includes letters A-Z, numbers 0-9, punctuation marks, and common symbols.

Musicians have been known to code short messages into music, performances, and recordings. In order to improve prior attempts to code messages within music, the present invention provides a method and system for coding messages of any length within musical compositions, with or without the aid of a computer or the internet, which could be helpful in emergency situations.

SUMMARY OF THE INVENTION

The present inventor realized the need for a method to code messages of any length into music and herewith provides a unique method and system for coding messages within musical compositions. The present invention includes assigning alphanumeric characters and symbols to black and white piano keys in accordance with a selected music scale or music mode, and then aligning the aforementioned elements with Standard Music Notation (SMN) for the purpose of creating, composing, and translating coded messages within musical compositions.

A human and/or groups of humans could benefit from the present invention by teaching the present invention, which could enhance growth and knowledge in the realms of education, communication, business and/or the private sector.

A machine could benefit from the present invention because deep learning, big data, and machine learning may be improved whether or not the present invention is explicitly programmed into a machine.

DETAILED DESCRIPTION OF THE INVENTION

The present invention is described in enabling detail. Various refinements and substitutions of the various elements and embodiments are possible based on the principles and teachings herein.

Figure 1:
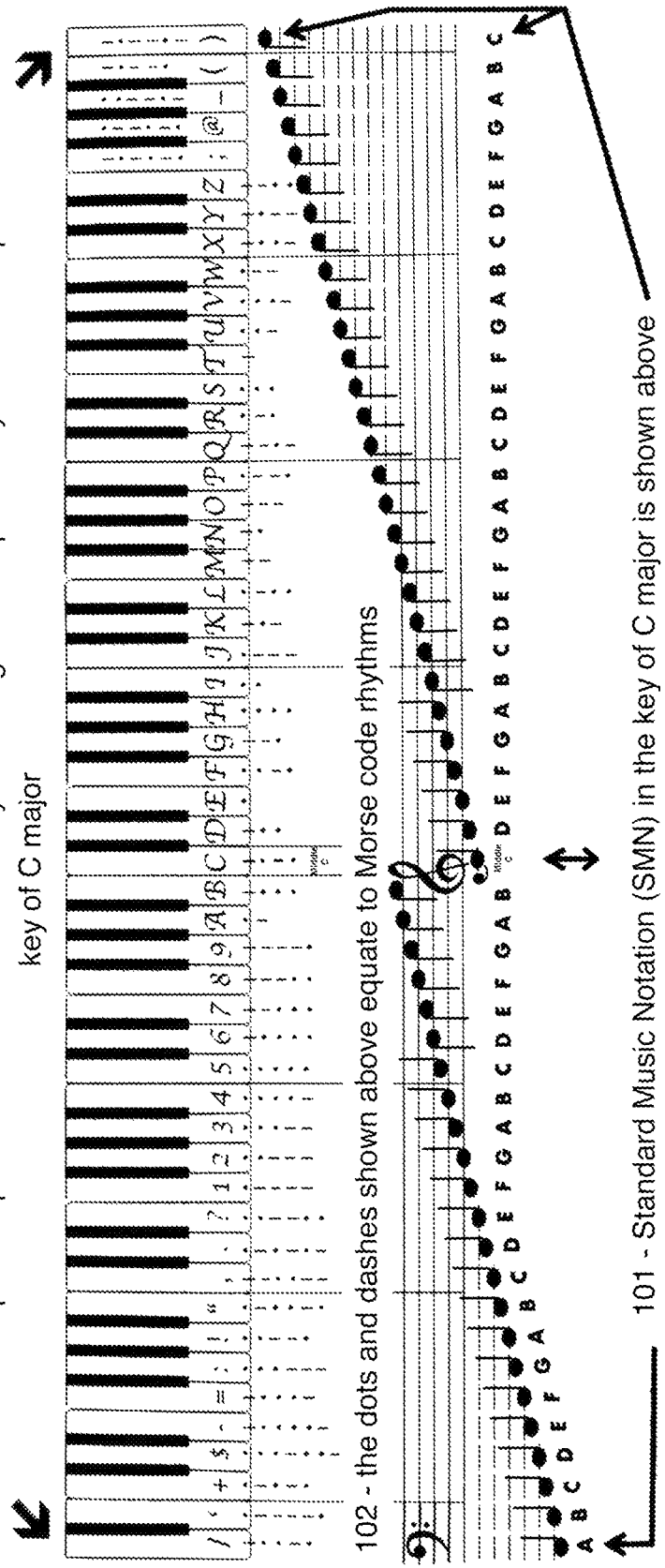
FIG. 1 illustrates a key chart diagram of an exemplary preferred embodiment in the key of C major to render coded messages within musical compositions of any length in accordance with the present invention.

The present invention may become more apparent from the following detailed description of the preferred embodiment in conjunction with the accompanying drawing, in which: FIG. 1 illustrates a diagram of an exemplary preferred embodiment depicting each alphanumeric character, number, symbol and punctuation mark of an alphanumeric character set assigned to a unique position on piano keys of a piano keyboard with 88 keys, aligned in accordance with each note of the C major musical scale, which is graphically represented by Standard Music Notation (SMN) in accordance with the present invention. A graphic representation of Morse code rhythms is also provided.

The present invention provides a unique method and system of creating, composing and translating Standard Music Notation (SMN) coded message musical compositions comprising of writing an alphanumeric message; providing a major, minor, melodic, chromatic or pentatonic music scale; or providing a music mode such as: Mixolydian, Lydian, Phrygian, Dorian, Hypolydian, Hypophrygian, Locrian, or Hypodorian; assigning an alphanumeric character set to a music mode or a music scale; depicting a diagram representing black and white piano keys which are paired and labeled with alphanumeric characters, numbers, symbols and punctuation marks and also aligned with Standard Music Notation (SMN) in accordance with the provided key of C major or a musical scale or a music mode. Rhythms may be utilized by designating any time signature, no time signature and/or Morse code rhythms for the purpose of creating, composing and/or translating Standard Music Notation (SMN) coded message musical compositions. In addition, embodiments of the present invention, method, and/or system may be electronically and/or manually applied to, combined, integrated, included with or within but not limited to: music, musical compositions, music performance, recordings, computer applications, film, virtual reality, and video games.

Referring to FIG. 1 the method and system of the present invention comprises three general components: aligning alphanumeric characters, numbers, symbols and punctuation marks in unique positions on piano keys 100 in accordance with a provided music scale or music mode; aligning Standard Music Notation (SMN) 101 with piano keys labeled with an alphanumeric character set; and conjoining any time signature, no time signature and/or Morse code rhythms 102 for the purpose of creating, composing and/or translating Standard Music Notation (SMN) coded message musical compositions.

Referring to FIG. 1, render a diagram depicting the black and white piano keys of an 88-key piano keyboard. Assign the components of an alphanumeric character set to unique positions on the piano keys of the 88-key piano keyboard by depicting the letter C of the alphanumeric character set on Middle C, depict letters D-Z in ascending order on the piano keys directly after Middle C, depict letters A and B in ascending order on the piano keys directly before Middle C, and depict the punctuation marks and symbols on the seventeen remaining white piano keys 100.

Depict the (SMN) music notes of the C major musical scale on a grand staff 101 aligned with piano keys displaying an alphanumeric character set placed in unique positions as specified in the above paragraph 100 and delineate the pitch of each music note on the grand staff (C, D, E, F, G, A, B) as shown in 101.

Depict Morse code time unit durations (dots and dashes) 102 in alignment with their equivalent character, number, symbol, or punctuation mark displayed on the piano keys as shown in 100.

Write an alphanumeric message.

Example: a dog jumped @ 2 cats.

Referring to FIG. 1, locate each character, number, symbol and punctuation mark of the alphanumeric message shown in the above example on the piano keys 100 and then locate each corresponding (SMN) music note on the grand staff 101.

A coded message melody is created when an unaltered sequence of each character, number, symbol and punctuation mark comprising an alphanumeric message of any length is located on the uniquely labeled piano keys 100 and then locating, pairing and depicting an unaltered sequence of each (SMN) music note on a grand staff 101 that corresponds to each component of the alphanumeric message.

Figure 2:
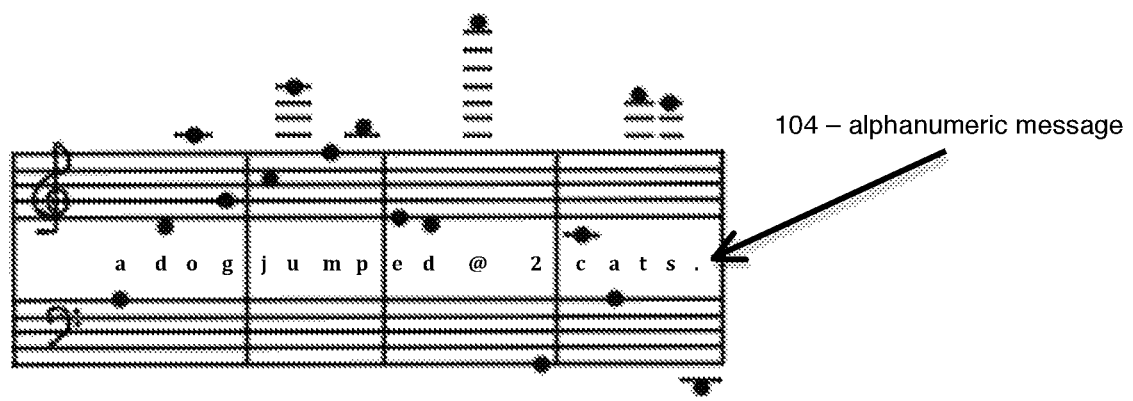
FIG. 2 illustrates a coded message melody derived and created from an alphanumeric message paired with each corresponding music note on a grand staff in accordance with the key of C major and the present invention.

Referring to FIG. 2, an example of a coded message melody derived and created from an alphanumeric message 104 paired with each corresponding music note on a grand staff in accordance with the key of C major and the present invention is depicted.

Composing a coded message musical composition may be accomplished by conjoining a coded message melody derived from each character, number, symbol and/or punctuation mark of an alphanumeric message 104 with any time signature, no time signature and/or Morse code rhythms.

Figure 3:
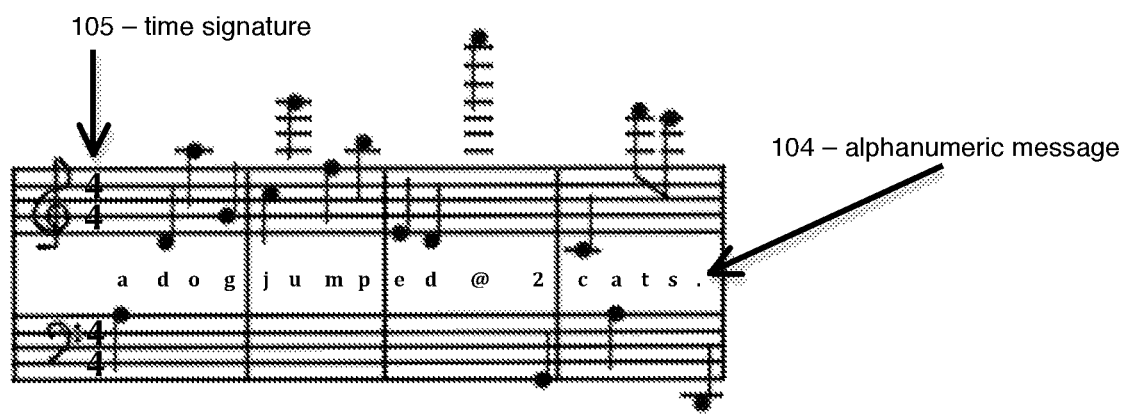
FIG. 3 illustrates a coded message musical composition in the key of C major created and composed by conjoining a coded message melody derived from each component of an alphanumeric message with a $_4^4$ time signature.

Referring to FIG. 3, an example of a coded message musical composition in the key of C major created and composed by conjoining a coded message melody derived from each component of an alphanumeric message 104 with a $_4^4$ time signature 105 is depicted.

Figure 4:
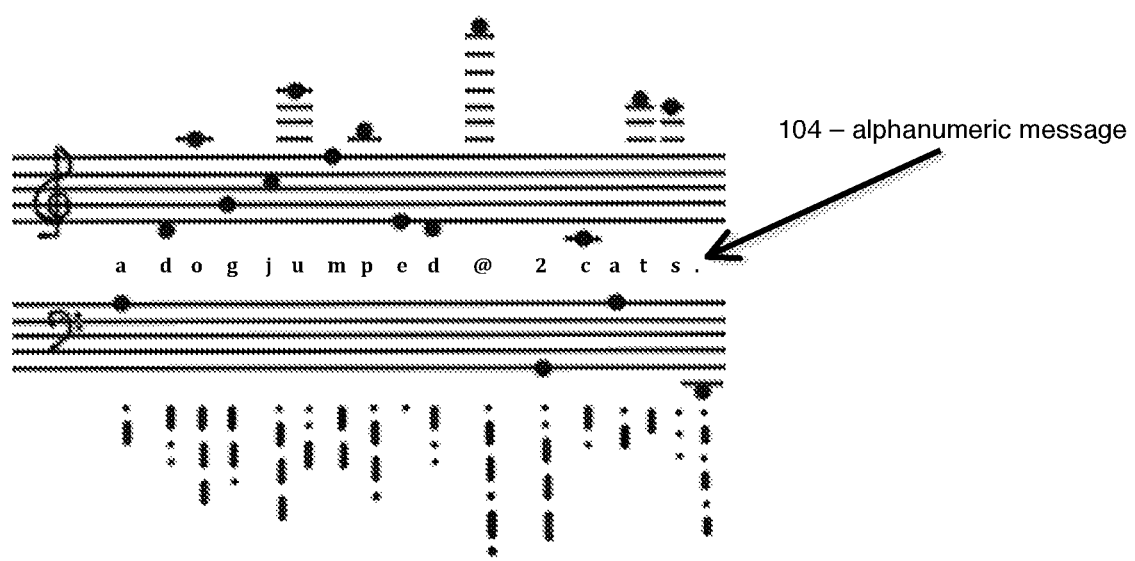
FIG. 4 illustrates a coded message musical composition in the key of C major with no time signature created and composed by conjoining a coded message melody derived from an alphanumeric message with Morse code rhythms.

Referring to FIG. 4, an example of a coded message musical composition in the key of C major with no time signature created and composed by conjoining a coded message melody derived from an alphanumeric message 104 with Morse code rhythms is depicted.

Furthermore, conveying the coded message contained within the coded message musical composition may be accomplished by tapping out the unaltered sequence of Morse code standard time durations (dots and dashes) derived from and aligned with each component of the alphanumeric message 104 or by sounding out the pitch of each (SMN) music note of the coded message melody using an unaltered sequence the Morse code standard time durations (dots and dashes) that are in alignment with each component of the alphanumeric message.

It will be apparent to one with skill in the art of music that the present invention method and system for coding messages within musical compositions may be provided using some or all of the mentioned sequences, features and components without departing from the spirit and scope of the present invention.

Transposing the present invention to an alternate music scale or music mode may be accomplished by grouping the individual characters, numbers, symbols and punctuation marks of the alphanumeric character set 100 with their corresponding Morse code standard time durations (dots and dashes) 102 and then moving that grouped unit up or down in pitch by a constant interval or the interval relationships of an alternate music scale or music mode.

It will also be apparent to the skilled artisan and/or musician that the embodiments described above are specific examples of a single broader invention, which may have greater scope than any of the singular descriptions taught. There may be many alterations made in the descriptions without departing from the spirit and scope of the embodiments and/or the present invention.

The foregoing is considered illustrative of the principles of the invention. Further, since numerous modifications and changes could readily occur to those skilled in the relevant art, it is not desired to limit the invention to the exact construction and operation shown and described, and accordingly all suitable modifications and equivalents that may be resorted to, fall within the scope of the invention.

The invention claimed is:

1. A method of coding messages within musical compositions comprising of:
   a. writing an alphanumeric message of any length with characters, numbers, symbols, and/or punctuation marks of an alphanumeric character set;
   b. providing a selection of any music scale or music mode;
   c. using a C major scale as the provided music scale;
   d. depicting piano keys of an 88-key piano keyboard in a diagram;
   e. assigning each character, number, symbol and punctuation mark in the alphanumeric character set to a unique position on the individual piano keys of an 88-key piano keyboard in accordance with the C major scale;
   f. depicting the unique position of each character, number, symbol and punctuation mark in the alphanumeric character set assigned to the piano keys of an 88-key piano keyboard in accordance with the C major scale;
   g. pairing each note of the C major scale on a grand staff graphically represented by Standard Music Notation (SMN) with the piano keys of an 88-key piano keyboard labeled with each character, number, symbol and punctuation mark in the alphanumeric character set in accordance with the C major scale;

h. depicting each (SMN) music note of the C major scale on the grand staff paired with the piano keys of an 88-key piano keyboard and labeled with each character, number, symbol and punctuation mark in the alphanumeric character set in accordance with the C major scale;
i. depicting each (SMN) music note on the grand staff aligned with alphanumeric letters identifying the pitch of each note in accordance with the C major scale;
j. aligning Morse code standard time durations (dots and dashes) with each corresponding character, number, symbol and punctuation mark in the alphanumeric character set assigned to the piano keys of the 88-key piano keyboard in accordance with the C major scale;
k. depicting the Morse code standard time durations (dots and dashes) aligned with each corresponding character, number, symbol and punctuation mark in the alphanumeric character set assigned to the piano keys of the 88-key piano keyboard in accordance with the C major scale;
l. depicting the unaltered sequence of each character, number, symbol and/or punctuation mark in the written alphanumeric message;
m. locating each character, number, symbol and/or punctuation mark of the written alphanumeric message on the piano keys of the 88-key piano keyboard in accordance with the C major scale;
n. locating each (SMN) music note aligned with each piano key corresponding to an unaltered sequence of each character, number, symbol and/or punctuation mark in the written alphanumeric message;
o. depicting the unaltered sequence of each (SMN) music note that is in alignment with each piano key that corresponds to the unaltered sequence of each identical character, number, symbol and/or punctuation mark in the written alphanumeric message derives and creates a coded message melody for a coded message musical composition in accordance with the C major scale; and
p. creating, composing and/or translating (SMN) coded message musical compositions may be accomplished by conjoining any time signature, no time signature and/or Morse code rhythms with the coded message melody derived from the unaltered sequence of each (SMN) music note that is in alignment with each piano key that corresponds to the unaltered sequence of each identical character, number, symbol and/or punctuation mark in the written alphanumeric message in accordance with the C major scale.

* * * * *